(12) United States Patent
Poznanski et al.

(10) Patent No.: US 10,680,659 B2
(45) Date of Patent: *Jun. 9, 2020

(54) SYSTEM AND METHOD FOR IMPROVED DECODING USING IDENTIFIED RECURRING SIDE INFORMATION

(71) Applicant: Verint Systems Ltd., Herzliya Pituach (IL)

(72) Inventors: Arik Poznanski, Ramat Gan (IL); Benjamin Imanilov, Hod haSharon (IL)

(73) Assignee: VERINT SYSTEMS LTD., Herzelia, Pituach (IL)

( * ) Notice: Subject to any disclaimer, the term of this patent is extended or adjusted under 35 U.S.C. 154(b) by 2 days.

This patent is subject to a terminal disclaimer.

(21) Appl. No.: 16/154,001

(22) Filed: Oct. 8, 2018

(65) Prior Publication Data

US 2019/0123767 A1     Apr. 25, 2019

Related U.S. Application Data

(63) Continuation of application No. 14/926,653, filed on Oct. 29, 2015, now Pat. No. 10,097,213.

(30) Foreign Application Priority Data

Oct. 30, 2014    (IL) .......................................... 235431

(51) Int. Cl.
*H04L 1/00*     (2006.01)
*H03M 13/41*    (2006.01)
*H03M 13/37*    (2006.01)

(52) U.S. Cl.
CPC ....... *H03M 13/41* (2013.01); *H03M 13/3723* (2013.01); *H04L 1/0054* (2013.01)

(58) Field of Classification Search
None
See application file for complete search history.

(56) References Cited

U.S. PATENT DOCUMENTS 6,671,325 B2   12/2003  Lee et al.
7,961,788 B2 *  6/2011  Song ..................... H04N 19/46
                                            375/240.01

(Continued)

OTHER PUBLICATIONS

3GPP TS 44.018 version 12.3.0, 3rd Generation Partnership Project; Technical Specification Group GSM/EDGE Radio Access Network; Mobile Radio Interface Layer 3 Specification; Radio Resource Control (RRC) Protocol, Release 12, 2014, 467 pages.

(Continued)

*Primary Examiner* — Phung M Chung
(74) *Attorney, Agent, or Firm* — Meunier Carlin & Curfman LLC

(57) ABSTRACT

Methods and systems for decoding monitored communication signals using previously identified side information. Information, which is used for decoding a given frame and is provided to the decoder not via the main communication channel between a base station and a mobile station, is referred to herein as "side information." The side information can also be viewed as extrinsic information that was derived during previous decoding operations. The monitoring system holds, for certain frames, a-priori information of one or more data values that are expected in these frames. Decoding using this a-priori information enables an Error Correcting Code decoder to successfully decode such frames, which would otherwise fail to decode.

13 Claims, 4 Drawing Sheets

(56) References Cited

U.S. PATENT DOCUMENTS

| | | |
|---|---|---|
| 8,166,355 B2 * | 4/2012 | Jashek .................. H04L 1/0057 |
| | | 714/708 |
| 8,689,074 B1 | 4/2014 | Tai |
| 8,689,084 B1 | 4/2014 | Tai |

OTHER PUBLICATIONS

Forney, G.D., "The Viterbi Algorithm," Proceedings of the IEEE, vol. 61, Issue 3, 1973, pp. 268-278.

Li, T., et al., "Joint Erasure Marking and Viterbi Decoding Algorithm for Unknown Impulsive Noise Channels," IEEE Transactions on Wireless, vol. 7, Issue 9, 2008, pp. 3407-3416.

* cited by examiner

SYSTEM AND METHOD FOR IMPROVED DECODING USING IDENTIFIED RECURRING SIDE INFORMATION

CROSS-REFERENCE TO RELATED APPLICATIONS

This present application is a continuation of and claims priority to U.S. patent application Ser. No. 14/926,653, filed Oct. 29, 2015, now U.S. Pat. No. 10,097,213 which claims priority to foreign application IL 235431 filed on Oct. 30, 2014 in Israel. The content of all priority applications are incorporated herein by reference in their entireties.

FIELD OF THE DISCLOSURE

The present disclosure relates generally to communication systems, and particularly to methods and systems for decoding using identified side information.

BACKGROUND OF THE DISCLOSURE

In various communication systems, information to be transmitted is encoded with an Error Correcting Code (ECC), such as, for example, a convolutional ECC. At the receiver, a suitable decoder decodes the ECC to recover the information. Decoding a convolutional ECC can be done, for example, using a Viterbi decoder that implements the Viterbi algorithm. The Viterbi algorithm is described, for example, in "The Viterbi Algorithm," Proceedings of the IEEE, March, 1973, Volume 61, Issue 3, pages 268-278, which is incorporated herein by reference.

Some ECC decoders are designed to accept side information, which may improve the decoding accuracy of the ECC. For example, a Viterbi decoder that accepts side information regarding corrupted symbols (erasures) is described, for example, in "Joint erasure marking and Viterbi decoding algorithm for unknown impulsive noise channels," IEEE transactions on wireless communications, volume 7, Issue: 9, Sep. 19, 2008, SEP, pages 3407-3416, which is incorporated herein by reference.

SUMMARY OF THE DISCLOSURE

An embodiment that is described herein provides a method, including monitoring a plurality of communication sessions that convey communication frames in a communication network. Recurrence information is derived from the monitored communication sessions, for a given type of the communication frames that are encoded with an Error Correction Code (ECC). The recurrence information indicates one or more data values that recur among the communication frames of the given type. In response to verifying that the communication frame belongs to the given type, the ECC in the communication frame is decoded based on the recurrence information.

In an embodiment, deriving the recurrence information includes analyzing the communication frames exchanged with multiple communication terminals. In another embodiment, deriving the recurrence information comprises analyzing the communication frames exchanged with two or more base stations.

In some embodiments, decoding the ECC includes applying a Viterbi algorithm with the recurrence information serving as side information. In other embodiments, the given type includes a channel Assignment command frame or a Handover command frame.

In an embodiment, deriving the recurrence information includes extracting the one or more data values from one or more communication frames received prior to the communication frame. In another embodiment, extracting the one or more data values includes extracting the one or more data values at least from a first communication frame communicated with a first device, and receiving the communication frame includes receiving a second communication frame communicated with a second device, which is different from the first device. In yet another embodiment, deriving the recurrence information includes receiving multiple communication frames that belong to one or more types, and classifying the multiple communication frames into the types based on the recurring data values among the communication frames of each type.

In some embodiments, deriving the recurrence information includes deriving the recurrence information for first and second different frame types, and decoding the ECC includes performing first and second ECC decoding attempts using the respective recurrence information associated with the first and second frame types to produce first and second decoded frames, and selecting either the first or second decoded frames. In other embodiments, receiving the communication frame includes assigning reliability measures to encoded symbols of the ECC, and modifying the assigned reliability measures based on the recurrence information. In yet other embodiments, deriving the recurrence information includes assigning respective modification factors to the one or more data values, and adding the modification factors to the respective reliability measures.

In an embodiment, assigning the modification factors includes evaluating a number of occurrences of each of the data values at respective position in the communication frames among multiple communication frames that belong to different types. In another embodiment, the modification factors are derived from predefined maximal and minimal reliability measure values.

There is also provided, in accordance with an embodiment that is described herein, a monitoring system including a frame analyzer and a receiver. The frame analyzer is configured to monitor a plurality of communication sessions that convey communication frames in a communication network, to derive from the monitored communication sessions, for a given type of the communication frames, that are encoded with an Error Correction Code (ECC), recurrence information indicating one or more data values that recur among communication frames of a given type, and to verify whether received communication frames belong to the given type. The receiver is configured to receive a communication frame, and in response to the frame analyzer verifying that the communication frame belongs to the given type, to decode the ECC in the communication frame based on the recurrence information.

The present disclosure will be more fully understood from the following detailed description of the embodiments thereof, taken together with the drawings in which:

DETAILED DESCRIPTION OF EMBODIMENTS

Overview

Figure 1:
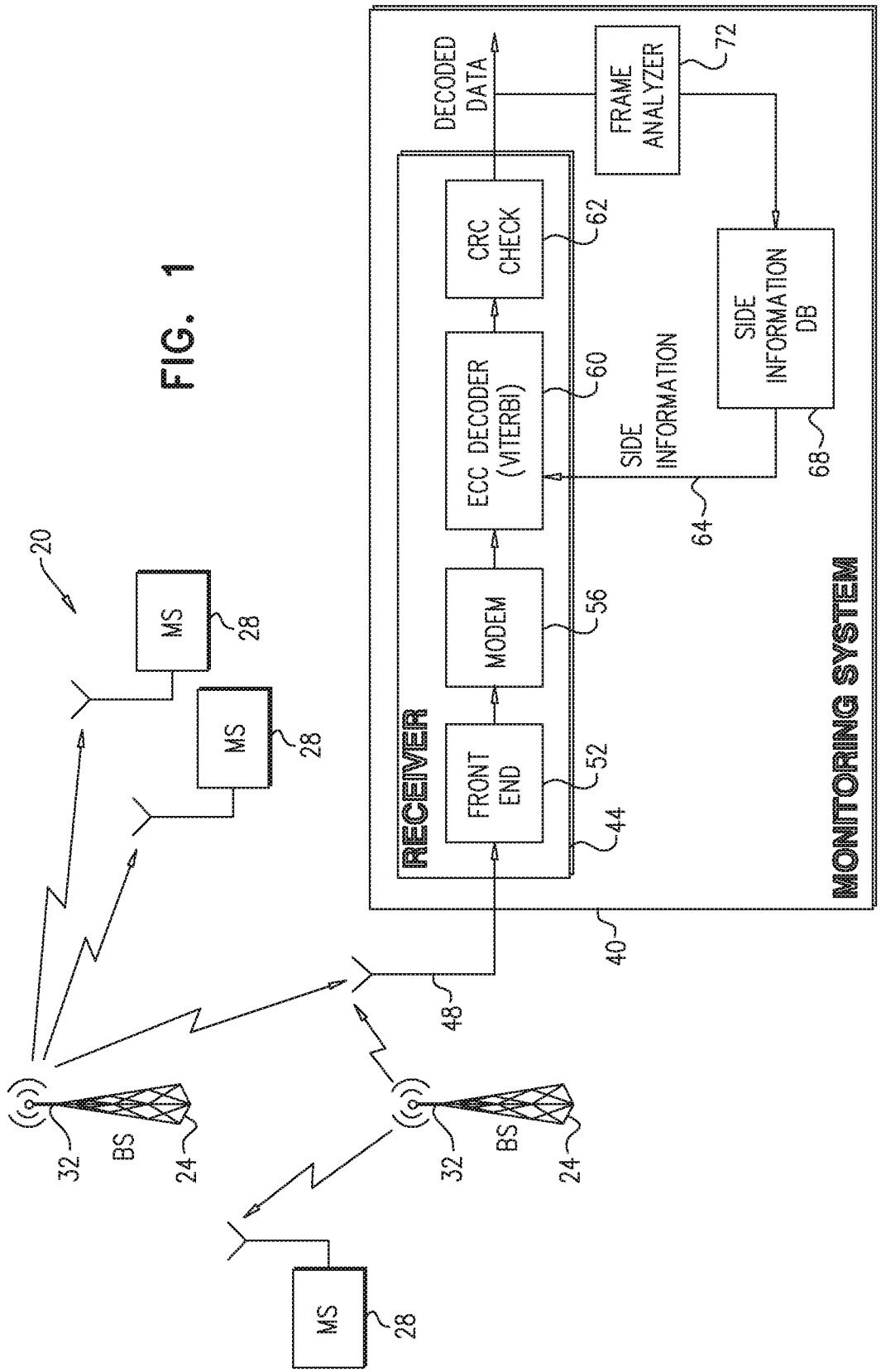
FIG. 1 is a block diagram that schematically illustrates a communication system and a monitoring system for capturing data transmitted over the communication system, in accordance with an embodiment that is described herein.

Various communication systems comprise Base Transceiver Stations (BTSs) that each communicates with one or more mobile terminals. The BTSs are also referred to as Base Stations (BSs), and the mobile terminals are also referred to as User Equipment (UE) or Mobile Station (MS). A monitoring system for capturing information sent over the communication system is typically equipped with a receiver designed to receive and decode a wide range of communication signals, which the BSs communicate with the mobile terminals.

Embodiments that are described herein provide improved methods and systems for decoding monitored communication signals using previously identified side information. The side information can also be viewed as extrinsic information that was derived during previous decoding operations. Information sent over the communication system is typically organized in communication frames (or simply frames, for brevity), which are encoded with an Error Correction Code (ECC). In some embodiments, the encoder attaches to the frame redundancy bits prior to ECC encoding. The encoder may derive the redundancy bits using any suitable code such as a Cyclic Redundancy Code (CRC) or a Fire code. The receiver of the monitoring system comprises an ECC decoder suitable for decoding the ECC that was applied in the BS. Following ECC decoding, the receiver processes the CRC or Fire code to check whether the information in the decoded frame is correct.

In some practical situations, the signals at the monitoring system are received at a level such that the received frame contains errors beyond the error correction capability of the ECC. In some embodiments, the monitoring system holds, for certain frames, a-priori information of one or more data values that are expected in these frames. Decoding using this a-priori information enables the ECC decoder to successfully decode such frames, which would otherwise fail to decode. Information, which is used for decoding a given frame and is provided to the decoder not via the main communication channel between the BS and the MS, is referred to herein as "side information."

In some embodiments, one or more data values may recur in frames of a given type, often across different BTSs and/or UEs. In GSM, for example, frames that may contain recurring information include, for example, frames over which the BS sends Assignment and Handover commands. Data fields that recur in such messages include, for example, Training Sequence Indicator, Frequency List, Channel Mode and Multi-Rate Configuration of the audio codec. The recurring data values can be used as side information for decoding, as will be described below.

In some embodiments, the monitoring system learns the recurring information to be used in a given MS by identifying this recurring information from previous sessions or calls held with the given MS, with other MSs, and or with other BTSs.

Although frames such as Assignment and Handover frames contain recurring data values, the MSs typically keep no track of such recurring information, as it may have been sent previously to other MSs, and rely on receiving the entire frames. In contrast, the reception system receives frames that are intended to multiple MSs, identifies frames having recurring information, and stores this information, as will be described below.

In some embodiments, the monitoring system manages a Data Base (DB) of recurrence information. When initially starting the monitoring system, the DB is typically empty and the ECC decoder uses no side information for decoding the received frames. During operation, the monitoring system receives one or more frames of a given type, in which some data values recur, identifies the recurring data values in these frames, and stores the data values in association with the given frame type in the DB. In some embodiments, the DB stores separate recurrence information for different BSs.

In some embodiments, the monitoring system processes all the received frames to identify frames containing recurring data values that occupy a large part of the frame. As explained above, the monitoring system identifies the recurring information in frames that belong to different sessions. The identification of the recurring information can be based, for example, on the timing of the frames within the session, on the BS from which the frame originates and the like.

In some embodiments, the types of frames containing recurring data values are predefined. In other embodiments, these frame type are unknown beforehand. In such embodiments the monitoring system first receives frames of all types, and identifies among the received frames frame types for which data values recur using any suitable frame classification method. The identified frame types and respective identified data values are used for building the DB of recurrence information.

When decoding frames of a given type, for which the DB already stores recurrence information, the ECC decoder retrieves the respective recurrence information from the DB, and decodes the frame using the retrieved information as side information. Embodiments for Viterbi decoding using side information are disclosed further below. The Viterbi decoder uses the side information for modifying branch metrics derived from the main channel signals, as will be described in detail below.

In some embodiments, the recurrence information comprises hard data values (e.g., binary bit values) that recur at certain positions in all frames of the type in question. Alternatively, the recurrence information comprises soft information such as reliability measures that are assigned to the recurring hard data values. In an embodiment, the reliability measures quantify the likelihood of recurrence of the data values in the respective positions in the frame, among multiple frames of different types.

In some embodiments, the certainty regarding the frame type to be decoded is less than absolute. In such embodiments, the ECC decoder decodes the received frame multiple times, assuming different possible frame types (and thus different recurring information in the DB), resulting in multiple decoded frames. The monitoring system receiver then verifies a Cyclic Redundancy Check (CRC) in the decoded frames and outputs a decoded frame for which the CRC verification succeeds. Alternatively, (e.g., for certain control channels in GSM), the receiver attempts additional error correction by processing the frame including redundancy bits of a Fire code, and rejects the frame in response to Fire decoding failure.

The disclosed techniques use the fact that some frame types contain data that is largely repetitive among the frames (even though the frames belong to different sessions with different MSs, e.g., identified at specific call states). This commonality enables the decoder of the monitoring system to decode frames that are received under poor channel conditions and contain large numbers of errors. This technique is especially relevant to monitoring receivers, which often receive weak signals and have no control over the main communication channel.

System Description

FIG. 1 is a block diagram that schematically illustrates a communication system 20, and a monitoring system 40 for capturing data transmitted over the communication system, in accordance with an embodiment of the present invention. In the present example, system 20 comprises a Global System for Mobile Communications (GSM) system that allocates radio resources for communication in accordance with the 3GPP TS 44.018 specifications, which are described, for example, in 3GPP Technical Specification 44.018, entitled "3rd Generation Partnership Project; Technical Specification Group GSM/EDGE Radio Access Network; Mobile radio interface layer 3 specification; Radio Resource Control (RRC) protocol (Release 12)," (3GPP TS 44.018), version 12.3.0, September, 2014, whose disclosure is incorporated herein by reference.

In alternative embodiments, however, system 20 may operate in accordance with any other suitable communication standard or specification, such as, for example, an Evolved Universal Terrestrial Radio Access (E-UTRA) system, which is also referred to as a Long Term Evolution (LTE) network, and UMTS Terrestrial Radio Access (UTRA) systems (also sometimes referred to as Wideband Code Division Multiple Access—WCDMA).

System 20 comprises multiple Base Stations (BSs) 24 each communicating with one or more mobile communication terminals 28. In GSM terminology, a mobile terminal is also referred to as a Mobile Station (MS). Each BS transmits to the MSs with which it communicates downlink signals, and receives from these MSs uplink signals. A BS that communicates with a given MS is also referred to as the serving BS for that MS. The downlink and uplink signals comprise control signals and optionally data-carrying signals. The control signals carry, for example, signaling information for synchronization and management tasks such as call setup and handover.

In the description that follows we mainly refer to monitoring downlink communication signals sent from the BS to the MS. The disclosed techniques, however, apply to monitoring uplink signals as well.

We now describe the main data processing in the downlink direction. Similar processing occurs in the uplink direction as well. BS 24 typically organizes the sent information in data units that are referred to herein as communication frames, or simply frames for brevity. The BS encodes the information in each frame using a certain Error Correction Code (ECC). In some embodiments, prior to ECC encoding, the BS attaches to each frame redundancy bits of a Cyclic Redundancy Code (CRC), or a Fire code. The receiving end (i.e., an MS or monitoring system 40) may use the CRC for verifying successful decoding of the ECC.

In the context of the present invention and in the claims, a communication frame refers to a data unit whose ECC can be decoded independently of other communication frames. Although the frames serve as a basic unit for ECC encoding and decoding, a message sent from the BS to the MSs may spread over multiple frames, and is not necessarily aligned to frame boundaries.

Following ECC encoding, the BS typically modulates the data encoded in the frames in accordance with certain modulation scheme, converts the modulated digital signal to an analog signal, up-converts the analog signal to a suitable Radio frequency (RF), and transmits the RF signal toward the MS receiver using a transmitting antenna 32.

Monitoring system 40 in FIG. 1 is a listening system that is located in the same region as (at least some of) BSs 24 and MSs 28. System 40 captures communication signals sent from BSs 24 to MSs 28 and decodes the information carried in these signals. As will be described in detail below, monitoring system 40 identifies data values recurring in frames that belong to a given type, and uses the identified recurring information for improving the decoding of subsequently received frames of the given type.

Monitoring system 40 comprises a receiver 44 that receives and processes communication signals sent from BSs 24 to the MSs 28. Unlike a conventional Ms, however, which typically ignores signals (or messages) sent from the serving BS to other MSs, receiver 44 is typically configured to process signals and messages sent to multiple MSs by multiple respective serving BSs.

Receiver 44 receives via antenna 48 RF signals transmitted by BSs 24 and provides these RF signals to a RF front end unit 52. In an embodiment, for each BS, front end unit 52 extracts a respective RF signal, down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 56, and the ECC is decoded by an ECC decoder 60. In some embodiments, the output of modem 56 comprises soft values (as opposed to hard decisions), and ECC decoder 60 comprises a soft decoder.

By decoding the ECC, decoder 60 reconstructs the data that was input to the encoder at the BS. The reconstructed data is provided as the receiver output. In some embodiments, the ECC comprises a convolutional code, and ECC decoder 60 comprises a Viterbi decoder suitable for decoding the convolutional ECC. The structure and functionality of ECC decoder 60 implementing a Viterbi decoder are described in detail below. Alternatively, any other suitable type of ECC and/or decoder can be used.

In an example embodiment, the soft values input to ECC decoder 60 comprise hard decisions for the corresponding encoded symbols and respective reliability measures assigned to the hard decisions. The reliability measure may comprise any suitable metric that measures the reliability of the hard decision. For example, for binary hard decisions, the reliability measure may comprise a Log Likelihood Ratio (LLR) metric, which is derived from the ratio between the probabilities of the two hard decision values.

ECC decoder 60 can typically operate with or without side information 64. Side information 64 may comprise, for example, recurrence information indicating data values that recur in frames of certain types. Typically, when system 40 starts, no side information is available and ECC decoder 60 performs decoding without side information 64. During operation, system 40 identifies recurrence information in frames of certain types, and stores this information in a Data Base (DB) 68, as will be described below.

In some embodiments, the correctness of the ECC decoded frames is verified by a CRC check unit 62. Alternatively, unit 62 comprises a Fire code decoder, which performs error correction in addition to correctness verification. In some embodiments, CRC check unit 62 is implemented as part of decoder 60, rather than as a separate element.

System 40 further comprises a frame analyzer 72, which analyzes the decoded frames output by ECC decoder 60 and verified by CRC unit 62. In some embodiments, frame analyzer 72 identifies data values that recur among the frames of a given type. In one embodiment, the given type (or types) is predefined. In another embodiment, the frame types are unknown a-priori, and analyzer 72 classifies the received frames, based on identified recurring data values, into one or more types. The classified types correspond to frames having different recurring data values. Analyzer 72 can use any suitable classification method for classifying the received frames into types.

Frame analyzer 72 can map the identified recurring values to hard or soft recurrence information. In some embodiments, the identified recurring data values (e.g., bits) serve as hard recurrence information. In other embodiments, analyzer 72 evaluates the number of occurrences of the data values, in respective positions in the frame, among multiple frames of different types and stores this number, or the Log of the ratio between the number of occurrences and the number of different frame types, in DB 68 as soft recurrence information. For example, assume a number of M frame types and that K(n) denotes the number of occurrences in which a '0' value appears in bit-position n among the frames of the M types. The soft values (i.e., estimated probabilities) are given by $K(n)/M$ and $1-K(n)/M$ when expecting a '0' or '1', respectively. The respective LLRs to be added to the branch metrics are given by $Log[(K(n)/M)/(1-K(n)/M)]$ with opposite signs.

Frame analyzer 72 stores the identified recurring information in DB 68. When ECC decoder subsequently processes a frame whose type already exists in DB 68, the decoder retrieves the respective side information from the DB and uses decodes the frame using the retrieved side information. In some embodiments, frames of a given type that are sent by different BSs comprise different recurring data values. In such embodiments, DB 68 holds the recurring information associated with the respective frame types separately per BS.

The system configuration shown in FIG. 1 is an example configuration, which is chosen purely for the sake of conceptual clarity. Alternatively, any other suitable system configuration can be used. Generally, the different elements of system 40 may be implemented using software, hardware or a combination of hardware and software elements. In some embodiments, one or more of the elements of system 40, such as frame analyzer 72, are executed by a general-purpose processor, which is programmed in software to carry out the functions described herein. The software may be downloaded to the processor in optical or electronic form, over a network, for example, or it may, additionally or alternatively, be provided and/or stored on non-transitory tangible media, such as magnetic, optical, or electronic memory.

The configuration of system 40, the various processing tasks are divided among the different system elements depicted in FIG. 1, such as receiver 44, frame analyzer 72 and DB 68. This division, however, is not mandatory, and other suitable assignments of tasks to elements can also be used. For example, in some embodiments, a single processor may execute both ECC decoder 60 and frame analyzer 72.

Although the embodiments described herein refer mainly to cellular systems, the disclosed techniques are also applicable to a satellite system, a point-to-point communication link, or any other suitable communication system in which communication frames may contain recurring information. Additionally, although the disclosed techniques refer mainly to network monitoring, the techniques are also applicable to interception systems.

Trellis Based Convolutional Encoding

Figure 2:
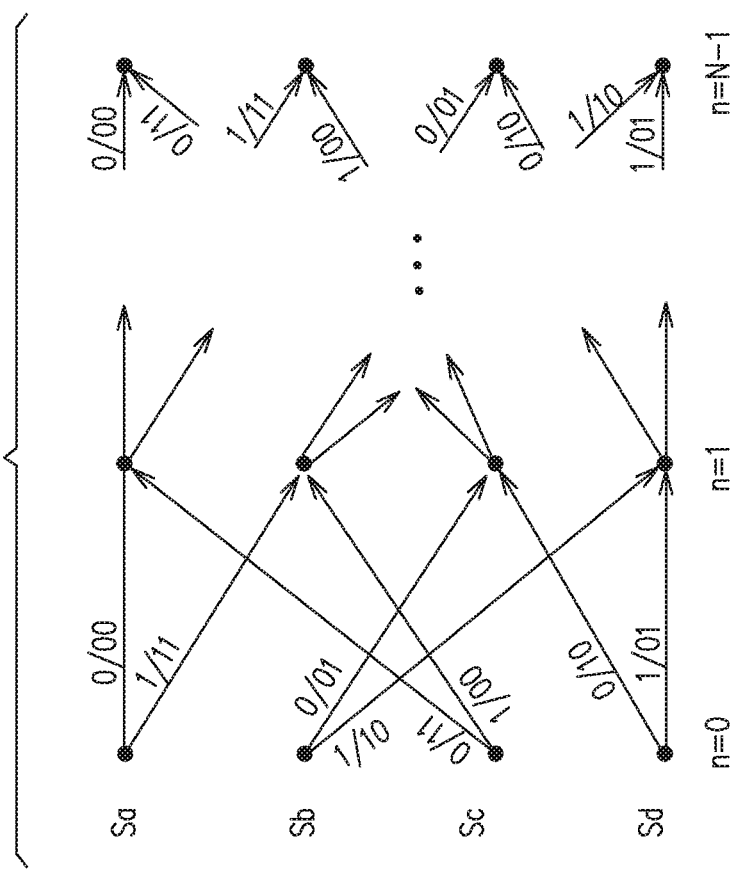
FIGS. 2A and 2B are a trellis diagram of a Viterbi decoder used in a monitoring system, and a respective state transitions table, in accordance with an embodiment that is described herein.

FIGS. 2A and 2B are a trellis diagram of a Viterbi decoder used in a monitoring system, and a respective state transitions table, in accordance with an embodiment that is described herein. The trellis diagram of FIG. 2A corresponds to an underlying rate 1/2 convolutional encoder. The figure depicts the trellis diagram over a discrete time axis $n=0$ . . . $N-1$. The rate 1/2 convolutional encoder (or similar) is used, for example, to encode frames that are delivered over certain control channels.

In the present example, the convolutional encoder accepts a sequence of input bits and outputs two bits per each input bit (i.e., rate 1/2 encoding). The convolutional encoder can be viewed as a state machine comprising four states, which are denoted Sa, Sb, Sc and Sc. In alternative embodiments, any other suitable number of states can be used, such as, for example, 16 states in certain control channels in GSM. Starting, for example, at state Sa, a given sequence of input bits causes the state machine to follow a certain state path along the trellis diagram, and to generate a respective sequence of two-bit outputs.

The transitions among the different states of the state machine are restricted to only valid transitions, which are depicted as arrows in the trellis diagram. In the present example, a valid transition from a given state at time n can occur to one out of only two states at time n+1, in accordance with the structure of the trellis. For example, when currently at state Sa, the next state can only be Sa or Sb, depending on the respective input bit value '0' or '1'.

When performing a state transition, the encoder produces a two-bit output value, which is also referred to herein as an "encoded symbol". For example, when the current state is Sc, a '0' ('1') input bit causes a transition to state Sa (Sb) and the encoder outputs a respective encoded symbol '11' ('00'). In an embodiment, the convolutional encoder can be implemented as a shift register into which the input bits are shifted, and logic applied to the content of the register, in accordance with predefined generation polynomials, to derive the output values.

The table of FIG. 2B summarizes all the valid state transitions from a previous state Sp to a next state Sw and the two-bit value outputs corresponding to the transitions. Note that in accordance with the trellis of FIG. 2A and the table of FIG. 2B, the trellis structure defines two valid transitions from a previous time instance to each state in the next time instance, meaning that the decision on a previous state (e.g., during Viterbi decoding) is a binary decision. For example, the state machine can transition to state Sb only from state Sa or Sc, and to state Sd only from Sb or Sd.

Viterbi Decoding Using Side Information

In some embodiments, ECC decoder 60 comprises a Viterbi decoder, which typically operates in two phases.

First, the Viterbi decoder estimates the trellis state path that was created by the convolutional encoder (at the BS). Then, the Viterbi decoder traces the estimated path back, to recover the respective input bit sequence.

In an embodiment, the Viterbi decoder holds a path metric value per state and time instance. The Viterbi decoder iteratively updates the path metrics based on the soft symbols, for example, using add-compare-select operations. The Viterbi decoder adds to each path metric branch metrics that are derived from the input soft symbols, and selects valid state transitions that correspond to the highest (lowest) path metric. At a given time instance, the path ending at a state having the highest (lowest) path metric is considered the most probable state path up to this time instance (including the final time instance of the frame.) Note—using the highest or lowest path metric is equivalent and depends on implementation. The Viterbi decoder typically selects the final surviving path and recovers the respective input bits when arriving at the last time instance of the frame, using a trellis trace back operation.

In some embodiments, the Viterbi decoder is provided with side information that indicates a-priori knowledge of the input bits to the encoder at certain time instances. The side information may comprise hard or soft information as will be described below.

Figure 3:
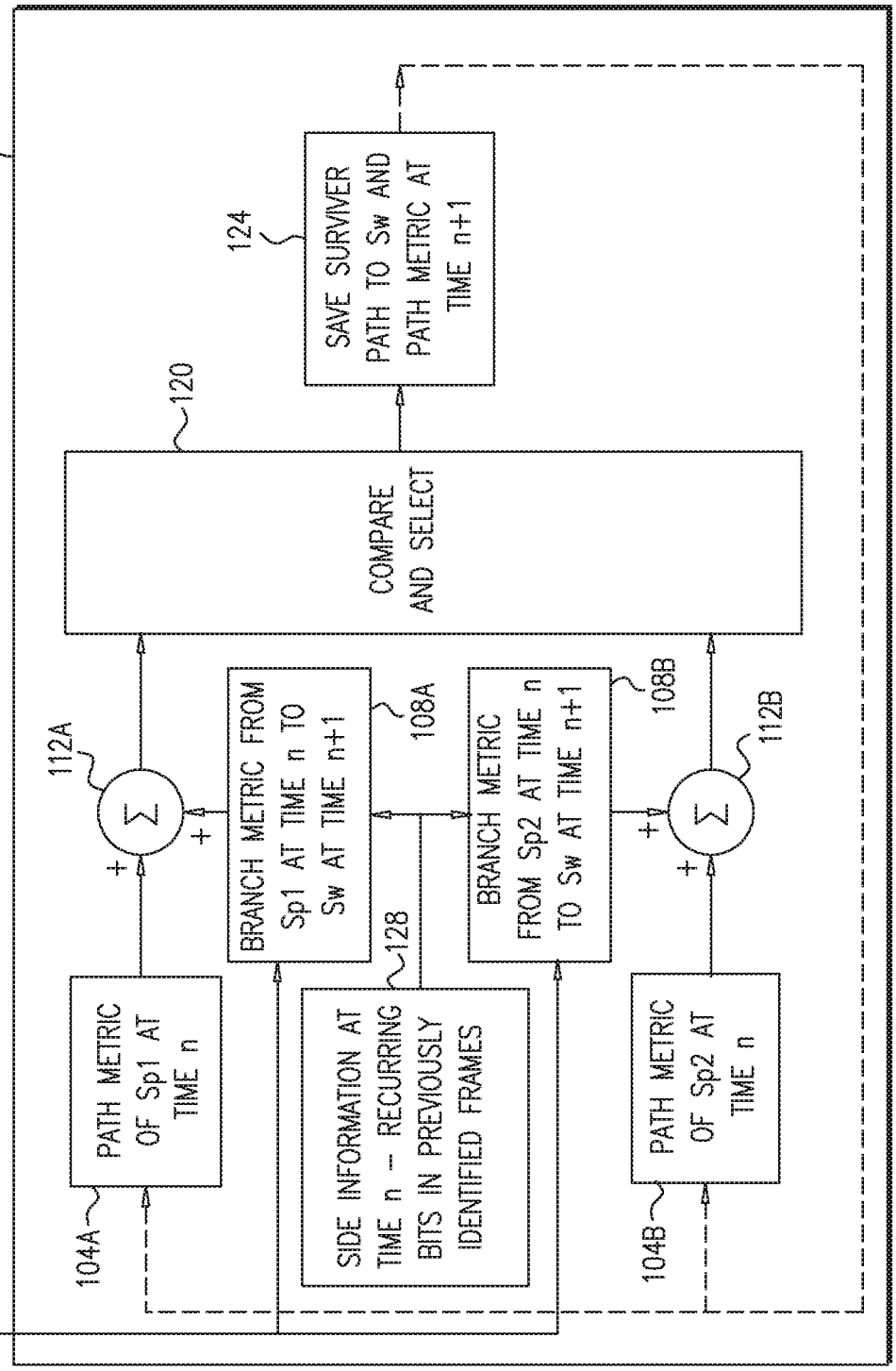
FIG. 3 is a block diagram that schematically illustrates a trellis building unit that uses side information to improve Viterbi decoding, in accordance with an embodiment that is described herein.

FIG. 3 is a block diagram that schematically illustrates a trellis building unit 100 that uses side information to improve Viterbi decoding, in accordance with an embodiment that is described herein. For example, trellis building unit 100 can be part of a Viterbi decoder implementing ECC decoder 60. In the present example, unit 100 builds a trellis structure in accordance with the trellis diagram and state transition table depicted in FIGS. 2A and 2B above.

Unit 100 comprises path metrics 104 assigned for each state at each time instance n. FIG. 3 depicts a pair of path metrics 104A and 104B of respective states Sp1 and Sp2, which are valid states for transitioning to state Sw at time instance n+1. Valid state transitions are summarized in the table of FIG. 2B above.

For valid transitions Sp1-Sw and Sp2-Sw, unit 100 calculates respective branch metrics 108A and 108B, and adds the branch metrics to the respective path metrics 104A and 104B using adder units 112. A compare and select unit 120 selects the lower between the two sums of adders 112 as the path metric 124 of Sw for the next iteration. At each time instance 0≤n≤N-1, unit 100 applies the described add-compare-select processing to each of the states Sa . . . Sd.

In some embodiments, branch metrics 108A and 108B comprise reliability measures, such as Log Likelihood Ratios (LLRs), assigned to the respective state transition decisions Sp1-Sw and Sp2-Sw. Unit 100 receives side information 128 (e.g., recurrence information 124 from DB 68). Unit 100 modifies branch metrics 108, based on side information 128, to improve the decoding accuracy.

Unit 100 can use the side information in various ways. For example, in some embodiments, side information 128 comprises hard decisions or bit values that are expected at certain time instances. When side information 128 indicates to unit 100 a given bit value that is expected at time instance n, unit 100 replaces (or adds to) one of branch metrics 108A or 108B a predefined maximal reliability measure value, and to the other branch metric a predefined minimal reliability measure value, based on the given bit value, which results in compare-and-select unit 120 selecting the more probable state transition from the valid previous states at time instance n−1.

In other embodiments, side information 128 comprises soft information regarding the expected bit values. For example, the soft information may comprise, for each expected bit value, a suitable reliability metric, such as the a metric that is based on the number of occurrences of the bit value among frames of different types, as described above. In some embodiments, unit 100 multiplies the pre-defined maximal and minimal reliability measures by the soft information values and adds the results to the respective branch metrics.

The configurations of trellis diagram and state transitions table of FIGS. 2A and 2B and of trellis building unit 100 of FIG. 3 above are given by way of example, and in alternative embodiments, any other suitable configurations can be used. For example, other trellis structures, having a number of states other than four, other sets of valid state transitions than those depicted in the table of FIG. 2B and/or assignments of encoded symbols other than the two-bit values depicted in FIG. 2A can also be used.

Although in FIG. 3 the Viterbi decoder selects state paths having the highest path metrics, this selection rule is not mandatory, and in alternative embodiments, the decoder can select sate paths having the lowest path metrics.

Figure 4:
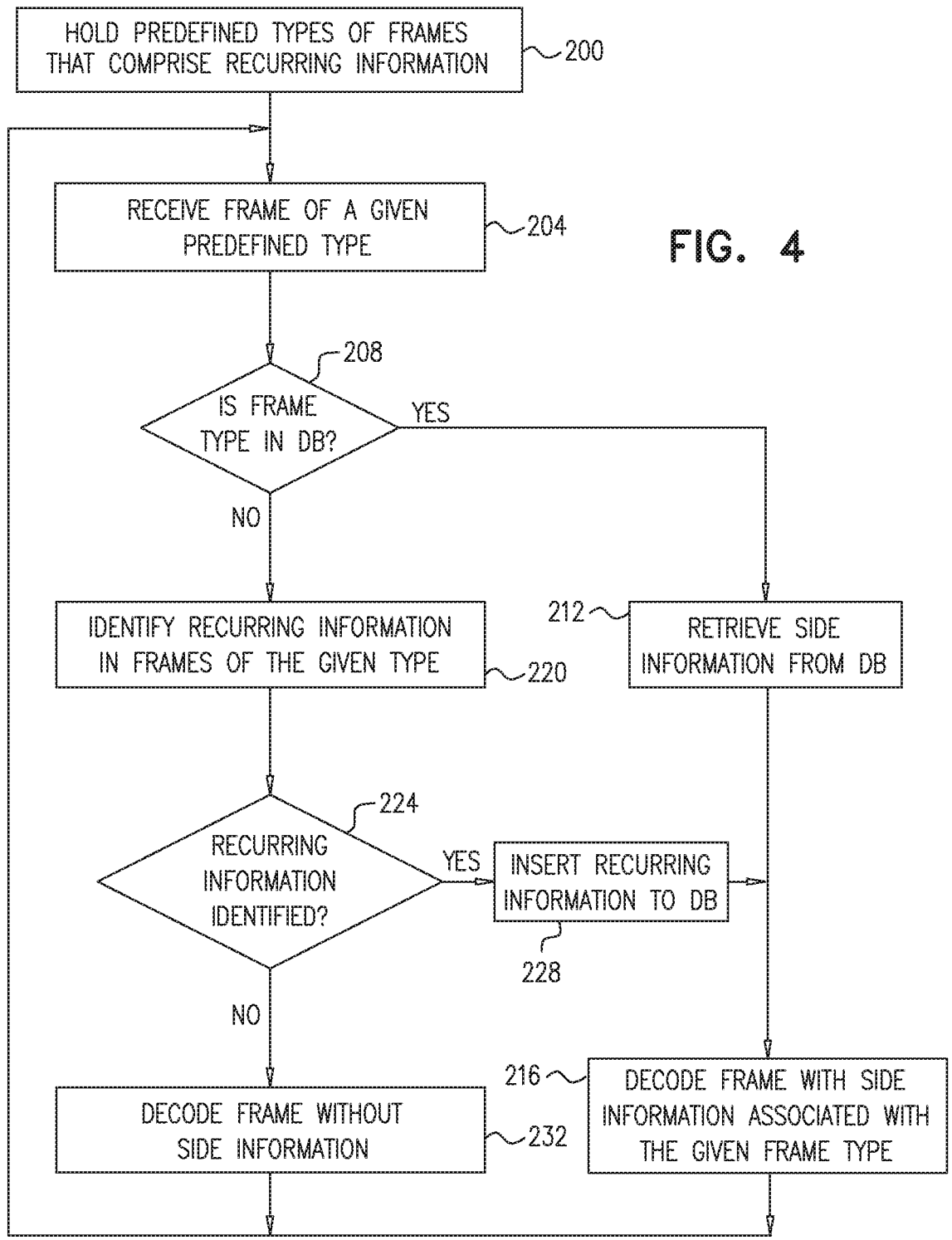
FIG. 4 is a flow chart that schematically illustrates a method for decoding an Error Correction Code (ECC) using previously identified recurring information in communication frames, in accordance with an embodiment that is described herein.

FIG. 4 is a flow chart that schematically illustrates a method for decoding an Error Correction Code (ECC) using previously identified recurring information in communication frames, in accordance with an embodiment that is described herein. The method can be executed, for example, by monitoring system 40. In the present example, we assume that ECC decoder 60 comprises a Viterbi soft decoder that uses side information, e.g., as described in FIG. 3 above.

The method begins with frame analyzer 72 holding predefined types of frames at a types holding step 200. Each predefined type corresponds to frames of a given type in which certain data values recur. At a receiving step 204, ECC decoder 60 receives soft values corresponding to a received frame that belongs to one of the predefined types.

In some embodiments, system 40 synchronizes with various signals communicated over communication system 20 to identify time instances in which frames of the predefined types are expected. For example, when system 20 comprises a GSM communication system, monitoring system 40 identifies time instances in which the BS sends messages such as Assignment and Handover messages or commands.

At a DB checking step 208, frame analyzer 72 checks whether the given frame type already exists in DB 68. If at step 208 analyzer 72 finds the frame type in the DB, analyzer 72 retrieves the recurring information associated with the given frame type from the DB at a retrieval step 212, and at an improved decoding step 216, ECC decoder 60 decodes the frame using the retrieved recurring information as side information as described, for example, in FIG. 3 above. The method then loops back to step 204 to receive subsequent frames. If at step 208 the frame type is not found, analyzer 72 proceeds to an identification step 220, in which analyzer 72 attempts to identify recurring information in frames of the given type.

In some embodiments, frame analyzer 72 identifies recurring information (step 220) regardless of whether the frame type is found or not in the DB (step 220). In such embodiments, analyzer 72 executes step 220 before executing step 208.

In some embodiments, analyzer 72 has a-priori knowledge of the internal structure of the frames, or the message carried by frames of the given type. In such embodiments, analyzer 72 extracts recurring data values from data fields that are known in advance. In alternative embodiments, analyzer 72 identifies recurring information, for example, by applying correlation methods over multiple frames of the given type.

At a verification step 224, analyzer 72 checks whether any recurring information was identified at step 220, and if found, analyzer 72 inserts the given frame type in association with the identified recurring data values to DB 68, at a storage step 228, and proceeds to step 216 to decode the frame using the side information as described above.

If at step 224 analyzer 72 does not identify any recurring information, analyzer 72 decodes the frame without side information, at a conventional decoding step 232, and the method loops back to step 204 to receive subsequent frames.

In some embodiments, the frame type at step 204 is not known with absolute certainty. For example, monitoring system 40 may expect each of the frame types in which data values recur with similar probabilities. In such embodiments, ECC decoder 60 performs steps 212 and 216 for each of the frame types defined at step 200 (or identified by frame classification, as described above), to produce multiple decoded frames. The decoder then performs Cyclic Redundancy Code (CRC) code verification (or Fire code decoding) to each of the decoded frames and selects the one for which the CRC or Fire code verification succeeds.

As described above, in some embodiments analyzer holds a set of predefined frame types, and for each predefined frame type the analyzer is aware of the internal structure of the messages carried by these frames. In GSM, example messages for which certain data fields recur in repeated message instances include the Assignment and Handover commands. The BS sends an Assignment command to a given MS to initiate a new communication channel, typically during call setup. The Handover command initiates in the MS a handover procedure in which the MS switches to another serving BS. The GSM Assignment and Handover commands are described, for example, in 3GPP Technical Specification 44.018, cited above.

The configuration in the method described in FIG. 4 above is exemplary configuration and other suitable configurations can also be used. For example, in some embodiments, instead of holding predefined frame types as described at step 200 above, frame analyzer 72 identifies recurring information in received communication frames, and classifies the frames into the different types accordingly, as described above.

Example Assignment Message

Table 1 below depicts an example of a field-captured Assignment command in a GSM system. The fields of the Assignment command are described, for example, in 3GPP Technical Specification 44.018, cited above. The rightmost column of Table 1 marks data fields that contain recurring information per a given BS. As seen in Table 1, significant part of the Assignment command is fixed for a given BS, and can therefore be used as side information to improve frame decoding on. Examples of fixed fields (per BS) include the Training Sequence Indicator, Hopping Sequence Number (HSN) for a hopping channel, Frequency List, Channel Mode and the Multi-Rate Configuration of the speech codec. Fields of the Assignment Command that change frequently include, for example, the Time slot used, and the Mobile Allocation Index Offset (MAIO).

TABLE 1

Assignment Command fields

| Information Element | Value recorded | Meaning of recorded value | Fixed per BS |
|---|---|---|---|
| Protocol Discriminator | 0x06 (6) | Radio resources management messages | Yes |
| Skip Indicator | 0x00 (0) | No indication of selected PLM | Yes |
| Assignment command Message Type | 0x2e | Assignment command | Yes |
| Description of the First Channel, after time | 0001 0... | TCH/H + Access, Subchannel 0 | |
| | .... .111 | Timeslot: 7 | |
| | 011. .... | Training Sequence: 3 | Yes |
| | ...1 .... | Hopping Channel: Yes | |
| | 0 | Hopping Channel: MAIO 0 | |
| | 7 | Hopping Channel: HSN 7 | |
| Power Command | 0... .... | Spare: 0 | |
| | .0... | CRC_mode: Channel(s) not in CRC mode | |
| | .... | | |
| | ..0. .... | FPC_EPC: FPC not in use for uplink power control | |
| | ...0 0101 | Power level: 5 | |
| Frequency List, after time | 0X05 | Element ID: 0x05 | Yes |
| | 16 | Length: 16 | Yes |
| | 00.. 000. | Format Identifier: bit map 0 | Yes |
| | 109, 84 | List of ARFCNS | Yes |
| Mode of the First Channel (Channel Set 1) | 0x63 | Element ID: 0x63 | Yes |
| | 0x41 (65) | Speech full rate or half rate version 3 | Yes |
| Multi-Rate Configuration | 0x03 | Element ID | Yes |
| | 5 | Length | Yes |
| | 001. .... | Multirate speech version: Adaptive Multirate speech version 1 (1) | Yes |
| | ...0 .... | NSCB: Noise Suppression can be used (default) (0) | Yes |
| | .... 0... | ICMI: Initial Codec Mode Indicator | Yes |
| | .... ..00 | Start Mode: 0 | Yes |
| | 0... .... | 12.2 Kbit/s rate: no | Yes |
| | .0.. .... | 10.2 Kbit/s rate: no | |
| | ..0. .... | 7.95 Kbit/s rate: no | |
| | ...1 .... | 7.40 Kbit/s rate: yes | |
| | .... 0... | 6.70 Kbit/s rate: no | |
| | .... .1.. | 5.90 Kbit/s rate: yes | |
| | .... ..0. | 5.15 Kbit/s rate: no | |
| | .... ...1 | 4.75 Kbit/s rate: yes | |
| | ..01 0111 | AMR Threshold: 11.5 dB (23) | Yes |
| | 0011 .... | AMR Hysteresis: 1.5 dB (3) | Yes |
| | .... 0111 11.. .... | AMR Threshold: 15.5 dB (31) | Yes |
| | ..01 00.. | AMR Hysteresis: 2.0 dB (4) | Yes |

Although the embodiments described herein mainly address improving decoding by using recurring information identified in previously communicated frames in a GSM communication system, the principles of the present disclosure can also be used for improving the decoding in other communication systems, in which certain frames include recurring information, such as LTE and WCDMA communication systems. The techniques disclosed herein can be used both in monitoring and interception systems.

It will be appreciated that the embodiments described above are cited by way of example, and that the present disclosure is not limited to what has been particularly shown and described hereinabove. Rather, the scope of the present disclosure includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
monitoring a plurality of communication sessions that convey communication frames in a communication network;
deriving from the monitored communication sessions, for a given type of the communication frames that are encoded with an Error Correction Code (ECC), recurrence information that indicates one or more data values that recur among the communication frames of the given type; receiving a communication frame; and
in response to verifying that the communication frame belongs to the given type, decoding the ECC in the communication frame based on the recurrence information.

2. The method according to claim 1, wherein deriving the recurrence information comprises analyzing the communication frames exchanged with multiple communication terminals.

3. The method according to claim 1, wherein deriving the recurrence information comprises analyzing the communication frames exchanged with two or more base stations.

4. The method according to claim 1, wherein decoding the ECC comprises applying a Viterbi algorithm with the recurrence information serving as side information.

5. The method according to claim 1, wherein the given type comprises a channel Assignment command frame or a Handover command frame.

6. The method according to claim 1, wherein deriving the recurrence information comprises extracting the one or more data values from one or more communication frames received prior to the communication frame.

7. The method according to claim 6, wherein extracting the one or more data values comprises extracting the one or more data values at least from a first communication frame communicated with a first device, and wherein receiving the communication frame comprises receiving a second communication frame communicated with a second device, which is different from the first device.

8. The method according to claim 1, wherein deriving the recurrence information comprises receiving multiple communication frames that belong to one or more types, and classifying the multiple communication frames into the types based on the recurring data values among the communication frames of each type.

9. The method according to claim 1, wherein deriving the recurrence information comprises deriving the recurrence information for first and second different frame types, wherein decoding the ECC comprises performing first and second ECC decoding attempts using the respective recurrence information associated with the first and second frame types to produce first and second decoded frames, and selecting either the first or second decoded frames.

10. The method according to claim 1, wherein receiving the communication frame comprises assigning reliability measures to encoded symbols of the ECC, and modifying the assigned reliability measures based on the recurrence information.

11. The method according to claim 10, wherein deriving the recurrence information comprises assigning respective modification factors to the one or more data values, and adding the modification factors to the respective reliability measures.

12. The method according to claim 11, wherein assigning the modification factors comprises evaluating a number of occurrences of each of the data values at respective position in the communication frames among multiple communication frames that belong to different types.

13. The method according to claim 11, wherein the modification factors are derived from predefined maximal and minimal reliability measure values.

* * * * *